(12) United States Patent
Liang et al.

(10) Patent No.: US 6,573,177 B1
(45) Date of Patent: Jun. 3, 2003

(54) PROTECTION LAYER TO PREVENT UNDER-LAYER DAMAGE DURING DEPOSITION

(75) Inventors: Ming-Chung Liang, Taipei (TW); Stefan Tsai, Hsinchu (TW); Chai-Chi Chung, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/076,629

(22) Filed: Feb. 19, 2002

(51) Int. Cl.[7] ......................................... H01L 21/6763
(52) U.S. Cl. ...................................... 438/637; 438/691
(58) Field of Search ................................ 438/623, 625, 438/628, 637, 641, 644, 639, 622, 640, 672

(56) References Cited

U.S. PATENT DOCUMENTS

| 5,063,655 A | * | 11/1991 | Lamey et al. |
| 5,162,255 A | * | 11/1992 | Ito et al. |
| 5,609,994 A | * | 3/1997 | Lee |
| 5,846,441 A | * | 12/1998 | Roh |
| 6,180,518 B1 | * | 1/2001 | Layadi et al. |
| 6,399,236 B1 | * | 6/2002 | Ueno |

* cited by examiner

Primary Examiner—David Nelms
Assistant Examiner—P. Dang
(74) Attorney, Agent, or Firm—Finnegan, Henderson, Farabow, Garrett & Dunner, L.L.P.

(57) ABSTRACT

A semiconductor manufacturing method that includes defining a substrate, depositing a first layer over the substrate, providing a protection layer over the first layer, providing a layer of photoresist over the protection layer, patterning and defining the photoresist layer to form at least one photoresist structure having at least one substantially vertical sidewall and one substantially horizontal top, depositing a photo-insensitive material over the at least one photoresist structure and the protection layer with a chemical-vapor deposition process having at least one reactive gas, wherein an amount of the photo-insensitive material deposited on the top of the photoresist structure is substantially greater than an amount of the photo-insensitive material deposited on the at least one sidewall of the photoresist structure, and wherein the protection layer is non-reactive with the at least one reactive gas, and anisotropically etching the protection layer and the layer to be etched.

23 Claims, 1 Drawing Sheet

PROTECTION LAYER TO PREVENT UNDER-LAYER DAMAGE DURING DEPOSITION

DESCRIPTION OF THE INVENTION

1. Field of the Invention

This invention relates in general to a semiconductor manufacturing process and, more particularly, to a method for preventing under-layer damage during deposition processes.

2. Background of the Invention

With sub-micron semiconductor manufacturing processes being the prevalent technology in today's semiconductor manufacturing process, the demand for a high-resolution photolithographic process has increased. The resolution of a conventional photolithographic method is primarily dependent upon the wavelength of a light source, which dictates a certain fixed distance between patterns on a photoresist. The distance separating patterns smaller than the wavelength of the light source could not be accurately patterned and defined.

Prior art light sources with shorter wavelengths are normally used in a high-resolution photolithographic process. In addition, the depth of focus of a high-resolution photolithographic process is shallower than a relative low-resolution photolithographic process. Thus, a photoresist layer having a lower thickness is required. However, a photoresist layer with a low thickness is susceptible to damages from subsequent deposition steps as the reactive gases used in deposition steps react with certain layers of material. This susceptibility reduces the precision of patterning and defining of a photoresist, which prevents the dimensions of patterns on a photoresist from being reduced.

It is accordingly a primary object of the invention to provide a method for preventing under-layer from damage caused by subsequent deposition steps.

SUMMARY OF THE INVENTION

In accordance with the present invention, there is provided a semiconductor manufacturing method that includes defining a substrate, depositing a first layer over the substrate, providing a protection layer over the first layer, providing a layer of photoresist over the protection layer, patterning and defining the photoresist layer, and depositing a second layer over the patterned and defined photoresist layer with a chemical-vapor deposition process having at least one reactive gas, wherein the protection layer is non-reactive with the at least one reactive gas.

In one aspect, the layer of inorganic material is substantially conformal.

In another aspect, the step of depositing a second layer is performed at a temperature lower than a stability temperature of the patterned and defined photoresist layer.

Also in accordance with the present invention, there is provided a semiconductor manufacturing method that includes defining a substrate, depositing a first layer over the substrate, providing a protection layer over the first layer, providing a layer of photoresist over the protection layer, patterning and defining the photoresist layer to form at least one photoresist structure having at least one substantially vertical sidewall and one substantially horizontal top, depositing a photo-insensitive material over the at least one photoresist structure and the protection layer with a chemical-vapor deposition process having at least one reactive gas, wherein an amount of the photo-insensitive material deposited on the top of the photoresist structure is substantially greater than an amount of the photo-insensitive material deposited on the at least one sidewall of the photoresist structure, and wherein the protection layer is non-reactive with the at least one reactive gas, and anisotropically etching the protection layer and the layer to be etched.

In one aspect, the step of depositing a photo-insensitive material comprises a step of depositing a layer of polymer.

In another aspect, the amount of the photo-insensitive material deposited on the top of the photoresist structure is substantially greater than an amount of the photo-insensitive material deposited on the protection layer.

Further in accordance with the present invention, there is provided a semiconductor manufacturing method that includes defining a substrate, providing a first layer over the substrate, providing a protection layer over the first layer, providing a layer of photoresist over the protection layer, patterning and defining the photo resist layer to form at least two photo resist structures, wherein each of the photoresist structures includes substantially vertical sidewalls and a substantially horizontal top, and wherein the photoresist structures are separated by a space, depositing a layer of polymer on the tops of the photoresist structures and the space separating the photoresist structures with a chemical-vapor deposition process having at least one reactive gas, wherein an amount of the polymer deposited on the tops of the photoresist structures is substantially greater than an amount of the polymer deposited on the sidewalls of the photoresist structures, and wherein the protection layer is non-reactive with the at least one reactive gas, and anisotropically etching the polymer on the tops of the photoresist structures and in the space between the photoresist structures, the protection layer, and the first layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the invention, examples of which are illustrated in the accompanying drawings. Wherever possible, the same reference numbers will be used throughout the drawings to refer to the same or like parts.

Figure 1:
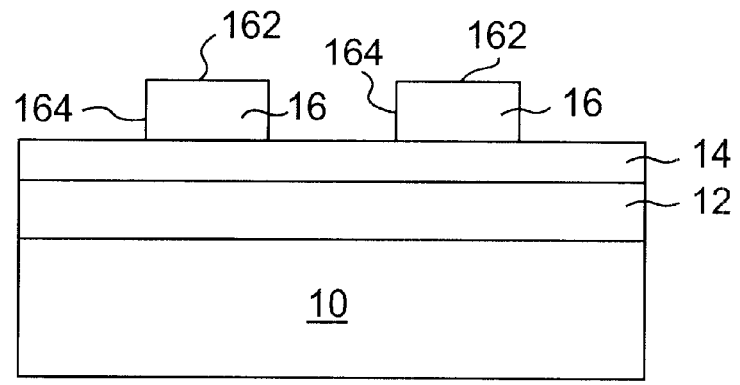
FIGS. 1–3 are cross-sectional views of the semiconductor manufacturing steps consistent with the present invention.
Figure 2:
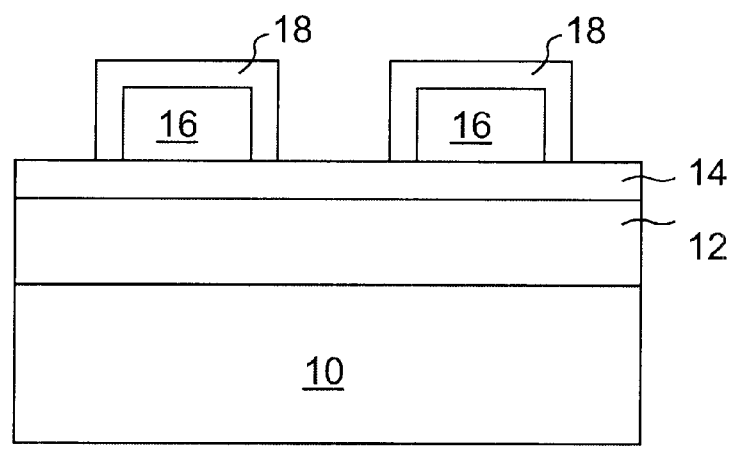
Figure 3:
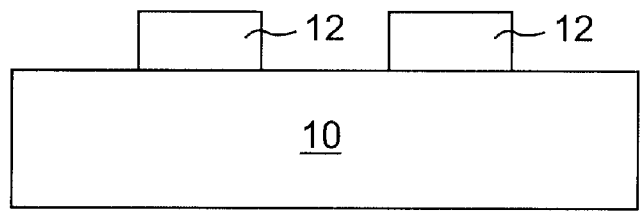

FIGS. 1–3 are cross-sectional view of the semiconductor manufacturing steps consistent with one embodiment of the present invention. Referring to FIG. 1, the method of the present invention provides a base layer 12 over a wafer substrate 10, which may be defined by any known process. The base layer 12 may be a metallic layer such as an aluminum or copper layer deposited over the substrate 10 by any known deposition process. The base layer 12 may also be a dielectric layer such as a layer of silicon dioxide ($SiO_2$), in which case the base layer 12 may be deposited or grown over the wafer substrate 10.

A protection layer 14 is provided over the base layer 12 to protect the base layer from subsequent deposition steps. The protection layer 14 is non-reactive with reactive gases, such as difluoromethane ($CH_2F_2$), a mixture of difluoromethane and octafluorobutene ($C_4F_8$), and a mixture of difluoromethane and trifluoromethane ($CHF_3$), introduced during deposition steps. The protective layer 14 may be organic or inorganic, and may have a thickness of approximately between 200 Å to 800 Å.

A photoresist layer 16 is provided over the protection layer 14. The photoresist layer 16 is then patterned and defined using a known process to form a patterned and defined photoresist layer having a plurality of photoresist structures 16. The photoresist structures 16 include substantially vertical sidewalls 164 and substantially horizontal tops 162.

Referring to FIG. 2, a second layer 18 is deposited over the patterned and defined photoresist layer 16 by known chemical vapor deposition (CVD) processes, such as plasma enhanced chemical vapor deposition (PECVD) and low pressure chemical vapor deposition (LPCVD). These known CVD processes may introduce one or more of reactive gases, difluoromethane ($CH_2F_2$), a mixture of difluoromethane and octafluorobutene ($C_4F_8$), and a mixture of difluoromethane and trifluoromethane ($CHF_3$). Because the protection layer 14 is non-reactive with the reactive gases difluoromethane ($CH_2F_2$), a mixture of difluoromethane and octafluorobutene ($C_4F_8$), and a mixture of difluoromethane and trifluoromethane ($CHF_3$), the protection layer 14 prevents the reactive gases from reacting with the base layer 12 during deposition of the second layer 18.

In addition, the second layer 18 may be organic or inorganic, and is photo-insensitive. In one embodiment, the second layer 18 is a polymer layer. In another embodiment, the second layer 18 is substantially conformal, covering the tops 162 and sidewalls 164 of the photoresist structures 16. In one embodiment, the amount of the second layer 18 deposited on the tops 162 of the photoresist structures 16 is substantially greater than the amount adhered to the sidewalls 164. In this embodiment, the photoresist structures 16 become more resistive to the subsequent etching steps, thereby preserving the precision of the photolithographic process. In addition, the step of depositing the second layer 18 is performed at a temperature lower than the stability temperature of the photoresist structures 16. In other words, the second layer 18 is deposited at a temperature not affecting the structural stability of the photoresist structures 16. After depositing the second layer 18, the space between the photoresist structures 16 is decreased, for example, from 0.22 microns to 0.02 microns.

Referring to FIG. 3, the structure comprising of the second layer 18, photoresist structures 16, protection layer 14, and base layer 12 are etched anisotropically with a plasma-based dry etching process. The second layer 18, the photoresist layer 16, and the protection layer 14 are completely etched away and the base layer 12 is etched to reveal the desired patterns.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor manufacturing method, comprising:
    defining a substrate;
    depositing a first layer over the substrate;
    providing a protection layer over the first layer;
    providing a layer of photoresist over the protection layer;
    patterning and defining the photoresist layer; and
    depositing a second layer over the patterned and defined photoresist layer with a chemical-vapor deposition process having at least one reactive gas.

2. The method as claimed in claim 1, wherein the second layer comprises a layer of inorganic material.

3. The method as claimed in claim 2, wherein the layer of inorganic material is substantially conformal.

4. The method as claimed in claim 2, wherein the step of depositing a second layer is performed at a temperature lower than a stability temperature of the patterned and defined photoresist layer.

5. The method as claimed in claim 1, wherein the protection layer is organic.

6. The method as claimed in claim 1, wherein the protection layer is inorganic.

7. The method as claimed in claim 1, wherein the first layer comprises a dielectric material.

8. The method as claimed in claim 1, wherein the first layer comprises a metallic material.

9. A semiconductor manufacturing method, comprising:
    defining a substrate;
    depositing a first layer over the substrate;
    providing a protection layer over the first layer;
    providing a layer of photoresist over the protection layer;
    patterning and defining the photoresist layer to form at least one photoresist structure having at least one substantially vertical sidewall and one substantially horizontal top;
    depositing a photo-insensitive material over the at least one photoresist structure and the protection layer with a chemical-vapor deposition process having at least one reactive gas, wherein an amount of the photo-insensitive material deposited on the top of the photoresist structure is substantially greater than an amount of the photo-insensitive material deposited on the at least one sidewall of the photoresist structure; and
    anisotropically etching the protection layer and the layer to be etched.

10. The method as claimed in claim 9, wherein the step of depositing a photo-insensitive material comprises a step of depositing a layer of polymer.

11. The method as claimed in claim 9, wherein the photo-insensitive material is inorganic.

12. The method as claimed in claim 9, wherein the step of depositing a photo-insensitive material is provided at a temperature not affecting the stability of the at least one photoresist structure.

13. The method as claimed in claim 9, wherein the amount of the photo-insensitive material deposited on the top of the photoresist structure is substantially greater than an amount of the photo-insensitive material deposited on the protection layer.

14. The method as claimed in claim 9, wherein the first layer comprises a metallic material.

15. The method as claimed in claim 9, wherein the first layer comprises a dielectric material.

16. A semiconductor manufacturing method, comprising:

defining a substrate;

providing a first layer over the substrate;

providing a protection layer over the first layer;

providing a layer of photoresist over the protection layer;

patterning and defining the photoresist layer to form at least two photoresist structures, wherein each of the photoresist structures includes substantially vertical sidewalls and a substantially horizontal top, and wherein the photoresist structures are separated by a space;

depositing a layer of polymer on the tops of the photoresist structures and the space separating the photoresist structures with a chemical-vapor deposition process having at least one reactive gas, wherein an amount of the polymer deposited on the tops of the photoresist structures is substantially greater than an amount of the polymer deposited on the sidewalls of the photoresist structures; and anisotropically etching the polymer on the tops of the photoresist structures and in the space between the photoresist structures, the protection layer, and the first layer.

17. The method as claimed in claim 16, wherein the layer of polymer is photo-insensitive.

18. The method as claimed in claim 16, wherein the step of depositing a layer of polymer is provided at a temperature not affecting the stability of the photoresist structures.

19. The method as claimed in claim 15, wherein the first layer is a dielectric layer.

20. The method as claimed in claim 15, wherein the first layer is a metallic layer.

21. The method as claimed in claim 1, wherein the second layer comprises a layer of organic material.

22. The method as claimed in claim 1, wherein the second layer comprises a layer of polymer.

23. The method as claimed in claim 1, further comprising removing both the second layer and the defined photoresist layer.

* * * * *